United States Patent
Guenther

[19]

[11] Patent Number: 5,973,416
[45] Date of Patent: Oct. 26, 1999

[54] METHOD FOR CONTROLLING A POWER SUPPLY SWITCH AND CIRCUIT ARRANGEMENT FOR PERFORMING THE CONTROL

[75] Inventor: Joachim Guenther, Ingolstadt, Germany

[73] Assignee: Temic Telefunken microelectronic GmbH, D 74072 Heilbronn, Germany

[21] Appl. No.: 08/936,309

[22] Filed: Sep. 24, 1997

Related U.S. Application Data

[63] Continuation-in-part of application No. 08/679,290, Jul. 12, 1996, abandoned.

[30] Foreign Application Priority Data

Jul. 20, 1995 [DE] Germany .............................. 195 26 493

[51] Int. Cl.[6] .................................................. H01H 47/00
[52] U.S. Cl. ............................ 307/125; 323/282; 361/93; 363/74
[58] Field of Search .................................... 307/125, 116; 363/21, 74, 97; 361/93; 323/282; 301/91

[56] References Cited

U.S. PATENT DOCUMENTS

| | | | |
|---|---|---|---|
| 5,146,386 | 9/1992 | Learned | 361/91 |
| 5,262,680 | 11/1993 | Hu . | |
| 5,262,933 | 11/1993 | Shyi-Hon | 363/21 |
| 5,352,868 | 10/1994 | Denen et al. . | |
| 5,383,086 | 1/1995 | Wietelmann et al. . | |
| 5,391,932 | 2/1995 | Small et al. . | |
| 5,510,943 | 4/1996 | Fukunaga | 361/93 |
| 5,672,917 | 9/1997 | Nakano | 307/116 |

FOREIGN PATENT DOCUMENTS

| | | |
|---|---|---|
| 3743453 | 7/1988 | Germany . |
| 3906886 | 9/1989 | Germany . |
| 4231037 | 3/1994 | Germany . |
| 2005935 | 4/1979 | United Kingdom . |

OTHER PUBLICATIONS

U. Tietze et al., Halbleiter–Schaltungstechnik, Springer Verlag, 1993, p. 209.

G. De Michele, "Protect Driver From Overload" Electronic Design, Sep. 19, 1994, pp. 136, 138, 140.

*Primary Examiner*—Albert W. Paladini
*Attorney, Agent, or Firm*—W. F. Fasse; W. G. Fasse

[57] ABSTRACT

The power supply to a load in a power supply circuit is controlled by a power supply switch which in turn is controlled by a control circuit and by a feedback signal representing a voltage drop across the load. The control circuit provides at its output a high level signal, a low level signal, and a high impedance signal level, whereby the high signal level initially closes the power supply switch, and the feedback signal normally keeps the power supply switch in its closed "ON-state" as long as said high impedance level prevails. The switch is caused to open and assume its "OFF-state" in response to a circuit fault as signified by said feedback signal or in response to said low level signal. A monitor detects the "ON" or "OFF" state of the switch under normal operating conditions and also the "OFF" state when a circuit fault such as a short occurred in the power supply circuit. The monitor further detects in the "OFF" state of the switch whether the load is connected to the power supply circuit or whether the power supply circuit is interrupted.

17 Claims, 4 Drawing Sheets

METHOD FOR CONTROLLING A POWER SUPPLY SWITCH AND CIRCUIT ARRANGEMENT FOR PERFORMING THE CONTROL

CROSS-REFERENCE TO RELATED APPLICATIONS

The present application is a continuation-in-part application of our, commonly assigned application U.S. Ser. No. 08/679,290, filed on: Jul. 12, 1996 abandoned.

FIELD OF THE INVENTION

The invention relates to a method for controlling a power supply switch in response to a control signal and in response to a feedback signal in a circuit arrangement for performing such a control.

BACKGROUND INFORMATION

Control systems for power supply circuits are known, for instance for providing a short-circuit protection with the help of external protective devices. Such devices detect an abruptly increasing short-circuit current and the power supply circuit is interrupted in response to such detection. Conventionally, a cyclical control is used especially in all digitally controlled systems. Due to such cyclical control the load current circuit, also referred to as power supply circuit, can be switched off only at the next clock cycle, whereby an extreme load could prevail for time durations that are too long. Such loads can occur, for example due to a short for a duration that is too long to prevent burn-out or accelerated aging of all circuit elements but in particular the power supply switch, the load element, and the supply voltage source.

Furthermore, systems are known which use a signal that can assume the states or levels "high", "low", and "high impedance", e.g. with a tristate transistor as described in Tietze/Schenk "Halbleiter-Schaltungstechnik" (Semiconductor Circuit Technology), 10th Edition, Springer Verlag, 1993, p. 209. There a microprocessor is used to provide these signal levels to determine the logic state of a signal conductor.

U.S. Pat. No. 5,391,932 (Small et al.), issued on Feb. 21, 1995, discloses a transistorized coupling circuit for coupling a d.c. power source to a data transmission line. A circuit arrangement is provided for recognizing an excess current situation. A control signal is generated in response to the excess current situation to switch off the power output stage for a defined length of time and thereafter to switch the power supply on again. The operability of the power supply output stage is not checked, whereby reactivation can be attempted even if the stage is not operable, for example when the short is still present in the circuit. The nature of the cause that interrupted the power supply circuit is not recognized.

U.S. Pat. No. 5,383,086 (Wietelmann et al.), issued on Jan. 17, 1995, describes a system and method for triggering an inductive load in the form of an inductive actuator. The current flowing through the actuator is sensed and a respective voltage is fed back to the control circuit. The control of the power supply stage can also be influenced with regard to its voltage supply and with regard to the operating temperatures to influence the scanning rate of the power output stage. Such a circuit is subject to the same short-comings as mentioned above in that the operability of the power output stage is not checked and the OFF-state is not maintained nor can it be checked what caused the OFF-state.

U.S. Pat. No. 5,352,868 (Denen et al.), issued on Oct. 4, 1994, discloses a resistance feedback controlled power supply circuit, wherein the power supply to a load with an ohmic power consumption is subject to a temperature control. The load is scanned with a high frequency alternating voltage while the temperature of the load is measured with the aid of a direct current voltage passing through a resistor.

U.S. Pat. No. 5,262,680 (Hu), issued on Nov. 16, 1993 discloses a switch control circuit for eliminating intermittent ON/OFF conditions on a power supply switch. Three comparators are used in the circuit for controlling a solenoid power supply switch which connects the power supply only to the load if certain power supply voltage levels are met.

OBJECTS OF THE INVENTION

In view of the above it is the aim of the invention to achieve the following objects singly or in combination:

to provide a method and apparatus for controlling a power supply circuit for a load or power consumer through a switch that is subject to different control signals, whereby it is preferred that the control of the switch shall be independent of scanning cycles and the time delays caused by such scanning cycles;

to permit an evaluation of the current status of the power switch to thereby avoid switching the power switch on when a fault such as a short exists in the power supply circuit;

to maintain automatically an OFF-status of the power switch until a new control signal is provided by the input control circuit, whereby the power switch cannot be switched on as long as there is a fault such as a short in the system;

to detect or monitor especially in an OFF-state of the circuit whether the power supply to the load is interrupted by causes other than that the power switch in its OFF-state; and to provide a power supply circuit with an efficient short-circuit protection without participation by the control circuit solely in response to a feedback signal, whereby the power output switch in the form of a monostable power switch flops back into the stable OFF condition.

SUMMARY OF THE INVENTION

According to the invention the ON/OFF state of a controllable power switch in a power supply circuit for a load is controlled by the following steps. First, a voltage drop signal is generated across the load to form a feedback signal. Second, the feedback signal is supplied to a control input (K) for normally controlling the ON/OFF state of the power switch through the feedback signal. Third, a switch control signal is generated for several purposes, namely for causing the power switch to initially assume an ON-state, for further enabling the feedback signal to normally maintain the ON-state of the switch, and for overriding the feedback signal, whereby the power supply circuit or switch can be switched-off by the feedback signal or by the control signal.

In the preferred embodiment the control signal can assume at different times three different signal levels, namely a control high signal level which is higher than a reference signal for initially causing the ON-state of the power switch, a control low signal level which is lower than the reference signal for causing an OFF-state of the switch, and an high impedance signal level that enables the control input to respond to the feedback signal for maintaining the ON-state by the feedback signal under normal operating conditions.

In the preferred embodiment a voltage drop across the load is used as the feedback signal. The control signal levels are supplied at different times to one input (K) of a comparator which also receives the feedback signal. A reference signal is applied to the other comparator input. The control signal with its high level signal initially switches the power switch to the ON-state. The power switch is maintained in the ON-state with the aid of the voltage drop or feedback signal as long as the voltage drop or feedback signal is larger than the reference signal connected to the other input of the comparator and the control signal assumes a high impedance signal level also referred to as the "Z-state". The power switch is switched to the OFF-state if the voltage drop or feedback signal falls below the reference signal in response to a fault in the power supply circuit. In the alternative, the power switch is switched off in response to the control signal assuming its low level for overriding the effect of the voltage drop or feedback signal.

It is an advantage of the invention that by using a control signal that can assume three different states (high, low, and Z-state), it becomes possible to provide further control options in addition to the state's "standard operation ON", standard operation OFF. The high impedance level or Z-state of the control signal permits maintaining the ON-state automatically as long as the feedback voltage signal maintains a certain level. When the feedback signal drops below that level an automatic shut-off is achieved. These advantages are applicable to a wide variety of uses in which the elements of the power supply circuit, particularly the power switch, the load element, and the feedback circuit are protected against overloads.

Another advantage of the invention is seen in that the status of the power switch and the other components of the circuit may be monitored which is advantageous for many applications. Thus, after the switch has been switched on while the control signal is in its high impedance state, it is possible to detect with a monitor and/or display device whether the load element is connected in the circuit, or whether a short circuit prevails. The respective information can be used to avoid switching the power supply circuit on again when there is a fault in the system. Even the nature of the fault may be detected according to the invention whether it is a short-circuit or an interrupted circuit.

The present method is performed by a circuit arrangement according to the invention in which a controllable power switch that connects a load to a power supply, is controlled by two signals applied to a switch control input (K) of the power switch. The control input (K) is connected to a control signal generating circuit (CSG) and to a feedback circuit and preferably also to a monitor or display. The control signal generating circuit develops at its output connected to the switch control input K a control signal that provides different control signals states at different times, namely a signal high level for initially causing an ON-status of the switch, a high impedance or Z-state for enabling the feedback signal to maintain the ON-state under normal operating conditions and a signal low level for overriding the feedback circuit, whereby the power switch can be switched off either by a drop in the feedback signal from the feedback circuit or by a low-level control signal from the control signal generating circuit.

In a preferred embodiment of the invention a comparator is connected with its output (V) to the control input of the switch while one comparator input is connected to a reference signal generator and the other input of the comparator is connected to the control signal generator and to the feedback circuit.

Where the present power switch is realized by an electronic switch, it is preferable to shunt the switch by a high ohmic resistance which makes it possible to detect whether the power supply circuit is interrupted by a circuit fault other than an open power switch.

In its preferred embodiment, the controllable switch is an electronic switching output stage, whereby involved circuit arrangements can be easily achieved for most uses. Such circuit may even include other switches as necessary, for example in connection with requirements imposed by maximum switching currents and switching voltages as well as with regard to power dissipation requirements.

Preferably, the feedback circuit is constructed to develop the feedback signal directly from the voltage drop across the load element with the added advantage that simultaneously a protection against high voltages is achieved by a Zener diode connected between the feedback circuit and ground. Further, the present circuit arrangement is easily adaptable to high voltage and high current requirements.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
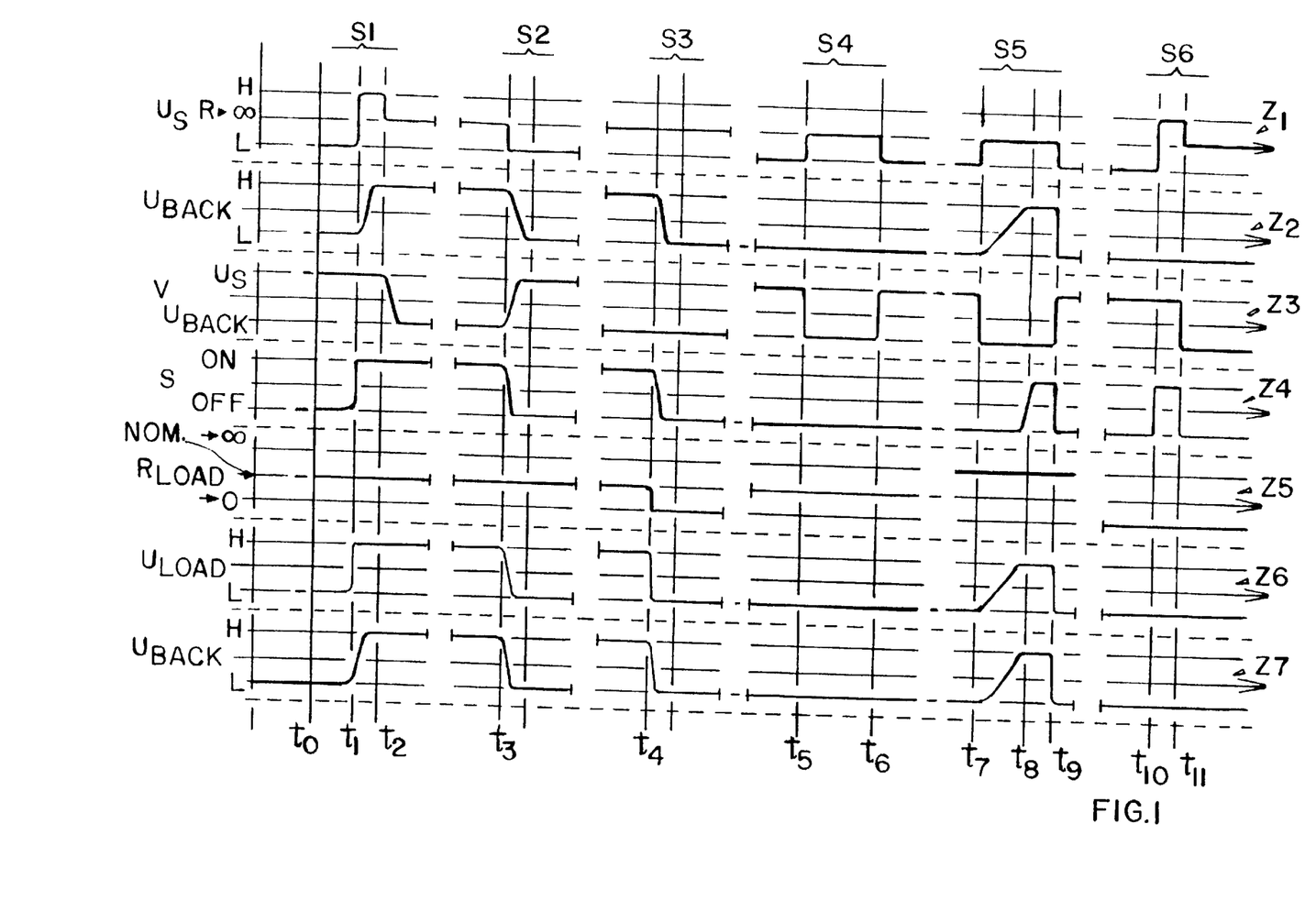
FIG. 1 shows the several waveforms and signals occurring as a function of time for different switching situations.
Figure 2:
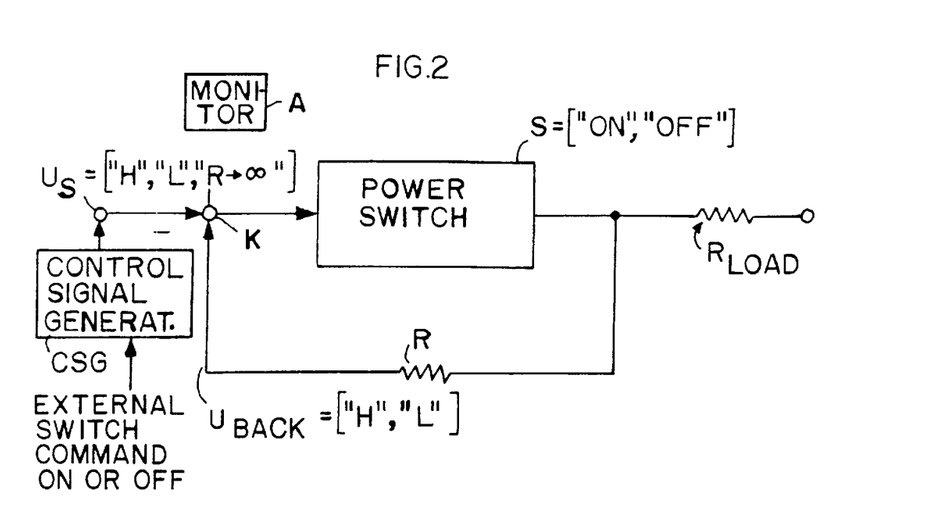
FIG. 2 illustrates in block form the basic switching circuit diagram according to the invention for performing the present method.

FIG. 1 shows all possible process states S1 to S6 in respective columns with reference to signal levels shown in lines Z1 to Z7 relating primarily to the operation of the circuit shown in FIG. 2. The following is observed in FIG. 1:

Line Z1, a control signal $U_S$ is generated for example by a control circuit CSG such as microprocessor $\mu P$ shown in FIG. 2 or a tristate transistor circuit. The control signal is generated to assume three levels or states "high", "low", and a high impedance state $U\infty$ also referred to as "Z-state".

Line Z2 relates to the feedback signal $U_{BACK}$ that depends on the operational condition of the load $R_{Load}$;

Line Z3, shows the comparison result V at the output of the comparator. The signal V at the output of the comparator can either be the value of the control signal $U_S$ or the feedback signal $U_{BACK}$. The signal V is supplied to the control input K of the power switch S to be described in more detail below, see FIG. 2.

Line Z4, shows the the switch S has assumed either the "ON" or "OFF" state at different times Line Z5, shows that the load element $R_{LOAD}$ is assumed to perform normally at the rated load, however, a short-circuit is designated as R→0 and a disconnected load is designated as R→∞ signifying an open circuit;

Line Z6 shows the normal voltage drop $U_{LOAD}$ across the load element $R_{LOAD}$.

Line Z7, is the feedback signal $U_{BACK}$ identical to line Z2.

Figure 3:
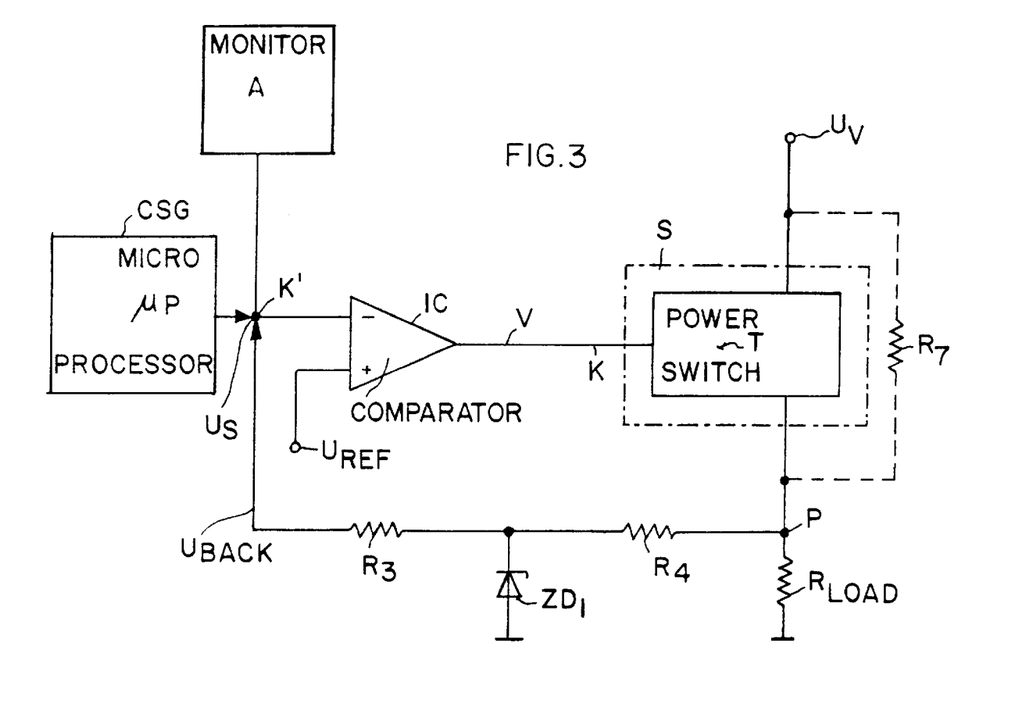
FIG. 3 illustrates an embodiment of a circuit arrangement in which the power switch is embodied by an electronic transistor switch connected to a power supply source, namely to the "high side" of the circuit and a monitor or read-out unit is connected to the control input (K') of the circuit.

The above designations refer to FIG. 2 to the extent necessary and are also used in FIGS. 3 to 7 as needed. FIG. 2 shows a block diagram of the basic power supply circuit for performing the present method. By assuming the high level H the control signal $U_S$ generated by the control signal generator CSG in response to an input signal from an external switch command shown in FIG. 2. The CSG may be a microprocessor µP as shown in FIG. 3. The CSG initially closes switch S which in turn closes the power supply circuit for the load element $R_{LOAD}$. A feed back or closed loop control circuit including a feedback resistor R provides the feedback signal $U_{BACK}$ which is applied to the same circuit junction K as the control signal $U_S$. The function K forms the control input of the power switch S. With this basic circuit in mind the present method will now be described with reference to FIG. 1. The instantaneous signal level or impedance presented by the control signal generator CSG at the junction K or K' and the instantaneous feedback signal level at the junction K or K' determine whether the control $U_S$ or the feedback signal $U_{BACK}$ will prevail in the control of the switch S. When CSG presents the Z-state of the junction K or K' the feedback signal prevails.

Otherwise the high level or the low level of the control signal $U_S$ prevails.

Column S1: Normal Switching "ON"

The control signal generator CSG which may be a microprocessor shown in FIG. 3 has an external switch command input shown in FIG. 2. The external input may simply be a pushbutton switch.

Figure 6:
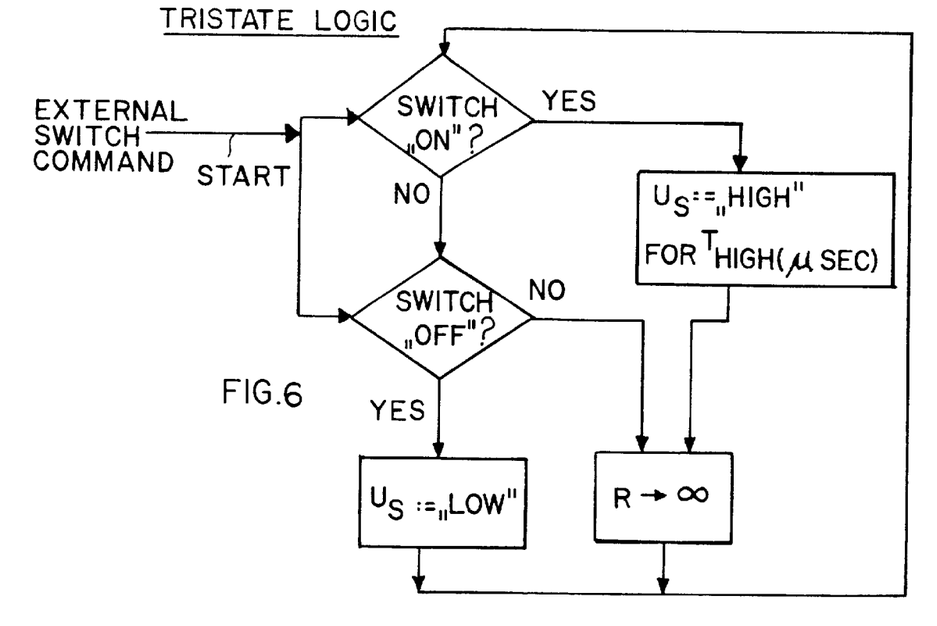
FIG. 6 shows a flow diagram for a control signal generator program that provides a tristate logic output.

Under normal operating conditions the load element $R_{LOAD}$ is connected with its rated load to the power supply circuit including a power source $U_V$ shown for example in FIG. 3. The power switch S is assumed to 18 in its "OFF-state" prior to being switched to its "ON-state" by an operator providing the external input. For an initial start-up operation, it is however recommended to first make sure that the switch S is in its "OFF" state. For this purpose a simple program for the CSG is shown in FIG. 6 for first setting the control signal $U_S$ to its "low" signal level as indicated at time $t_0$, whereby the switch S will assume its "OFF" position independently of the feedback signal $U_{BACK}$, since any signal levels which may possibly exist are grounded due to the control signal $U_S$ being set to its "low" level.

Once the power switch S is in the "OFF", the control signal $U_S$ is set to its "high" impulse level by the control signal generator CSG at time $t_1$, whereby the switch S will assume its "ON-state". Such switching to the "ON-state" takes place within the microsecond range. The high level control signal $U_S$ will be significantly higher than a reference level $U_{REF}$, whereby the switch S, and therefore the power supply circuit, will be closed, causing a voltage drop $U_{LOAD}$ across load element $R_{LOAD}$, thereby generating the feedback signal $U_{BACK}$ at its "high" level under normal operating conditions. At time $t_2$, the control signal $U_S$ will be switched into the high impedance or Z-state $U_\infty$, whereby the switch S responds to the feedback signal $U_{BACK}$ and remain in its "ON" state due to the "high" level of the feedback signal $U_{BACK}$ at a time when the control signal $U_S$ is at its Z-state.

Column S2: Normal Switching "Off"

During normal operation in the ON-state of the switch S the control signal $U_S$ maintains its high impedance level or Z-state. If the power supply circuit is to be interrupted by opening the switch S, the control signal $U_S$ will be switched to its low signal level by the CSG at time $t_3$, whereby the feedback signal $U_{BACK}$ no longer has any effect since the low level of the control signal $U_S$ will override the effect of the feedback signal $U_{BACK}$ due to the higher inner resistance or impedance of the circuit providing the feedback signal $U_{BACK}$. Thus, the switch S is opened and the voltage drop across the load element $R_{LOAD}$ will become almost zero. The feedback signal will thus be set to its low level, whereby the switch S in the form of a monostable circuit will flop back into its stable OFF-state.

Column S3: Switching "OFF" in Response to a Short-Circuit in the Power Supply Circuit If during normal operation a short-circuit occurs in the power supply circuit, as shown at time $t_4$ in column S3, line 5 of FIG. 1, the voltage drop becomes substantially zero, whereby the feedback signal $U_{BACK}$ also is set to its low level to thereby automatically switch off the switch S, while $U_S$ is still at its Z-state (R→∞).

Detection of Previous States of the Power Supply Circuit and its Components

FIG. 1 shows how previous states of the circuit arrangement are easily ascertained by a monitor or read-out unit A shown in FIGS. 2, 3, 4 and 5. Thus, for example if the control signal $U_S$ is in its high impedance or Z-state, the ON-state of the switch S can be detected on the basis of the high level that the feedback signal $U_{BACK}$ assumes at this time under normal operating conditions, please see FIG. 1, col. S1, line Z2 following time $t_2$. Following the time $t_4$ please see FIG. 1, col. S3, line Z2, the appearance of a low level feedback signal permits concluding that a short-circuit of the load $R_{LOAD}$ has occurred, please see FIG. 1, col. S3, line Z5. The monitor A is connected to the switch control input K or K' so that a detection of the feedback signal $U_{BACK}$ and of any other signal level at the switch control input K or K' by the monitor A is possible because the signal levels are superimposed on one another at these inputs.

Detection of the Cause for the "OFF-state" of the Switch S (Columns S4 and S5 of FIG. 1)

As shown in FIG. 3 the switch S is shunted by a high ohmic resistance $R_7$ which must be substantially larger than the ohmic resistance of the it load $R_{LOAD}$ ($R_7 >> R_{LOAD}$). Under this condition, it is possible according to the invention to ascertain even with the switch S in its "OFF-state", whether the load element $R_{LOAD}$ is connected in its power supply circuit or whether the power supply circuit is open. For this purpose the control signal $U_S$ is switched from its low state at the times $t_5$ or $t_7$ to its Z-state U∞ see columns S4, S5. If the load element $R_{LOAD}$ is still connected in the power supply circuit, a voltage divider including $R_7$ and the load resistance $R_{LOAD}$ is established in the load section of the circuit $$U_{LOAD} = \frac{R_{LOAD}}{R_7 + R_{LOAD}} \times U_V < \left(\frac{1}{10} \times U_V\right) < U_{REF}$$

This voltage divider causes the feedback signal $U_{BACK}$ to assume its low level. On the other hand, if the load resistance $R_{LOAD}$ is disconnected from its power supply, the load resistance will tend to ∞ ($R_{LOAD} \rightarrow \infty$), whereby the load voltage $U_{LOAD}$ becomes equal to the power supply voltage $U_V$, ($U_{LOAD}=U_V$), whereby the feedback signal assumes a high level. Such a high level feedback signal is capable of switching the switch S shortly to its ON-state as shown at $T_8$ in column S5 since the control signal $U_S$ is in its Z-state at this time, until the control signal $U_S$ switches the switch S off again when it assumes its low level at point $T_9$. Thus, an attempt to normally switch on the switch S when the power supply circuit is interrupted will be avoided.

Attempt to Switch the Switch S to the ON-State When a Short-Circuit Exists

When a short-circuit exists, the control signal $U_S$ assumes its high level within microseconds, whereby a current will flow through the power supply circuit between the times $t_{10}$ and $t_{11}$ in column S6. This current is limited only by the internal resistance of the switch S. In the preferred embodiment the switch S is an electronic power switching output stage T shown in FIGS. 4 and 5 comprising respective transistors, whereby an additional finite current amplification will have an additional current limiting effect. Additional current limiting circuit arrangements may be used to accommodate high currents and high power situations. At the time $t_{11}$ in column S6 the feedback signal $U_{BACK}$ assumes its low level due to the short-circuit and the switch is switched OFF.

Referring further to FIG. 2, the block diagram illustrates the control input K of the power switch S connected to the control signal generator CSG that generates the control signal $U_S$ which may assume the three different states high, low, and $Z(R \rightarrow \infty)$ as described above. A feedback circuit R provides the feedback signal $U_{BACK}$ that may assume a high level or a low level, depending on the voltage drop across the load element $R_{LOAD}$ as described above with references to FIG. 1. Thus, the feedback signal $U_{BACK}$ and the control signal $U_S$ are both supplied to the control input K of the power switch S, the output of which is connected to the load element $R_{LOAD}$ and to the feedback circuit R. A monitor A is also connected to the control input K as will be described in more detail below.

Under normal operating conditions the load current flows through the load element $R_{Load}$ when the switch S is in its ON-state. The feedback signal $U_{BACK}$ assumes its high level under normal operating conditions whereby the voltage drop across the load element $R_{Load}$ is normal. The feedback signal $U_{BACK}$ assumes its low level when the voltage drop across the load element is low, for example in a short-circuit situation or when a voltage drop across the load element does not exist when the power supply circuit is interrupted independently of the state of the power switch S. The arrangement of the feedback circuit R is such that the feedback signal controls the switch S at any time when the control signal $U_S$ is in its Z-state However, the control signal $U_S$ overrides the feedback signal when the control signal assumes its low or high level. The input and output impedances and the resistances of the circuit components are selected accordingly. The control signal generator CSG may be a microprocessor or a so-called tristate transistor circuit. Such circuits per se are conventional.

FIG. 3 illustrates a more detailed implementation of a power supply circuit according to the invention for performing the present method. A comparator IC in the form of an integrated circuit is connected with its output V to the control input K of the switch S implemented as a power transistor switch T. A reference generator not shown, but providing a reference voltage $U_{REF}$ is connected to the positive input of the comparator IC. The comparator IC is connected with its negative input to a circuit junction point K' that receives the feedback signal $U_{BACK}$ from the feedback circuit R3, R4 and the control signal $U_S$ from a microprocessor μP functioning as the control signal generator CSG. The junction point K' is further connected to the monitor A functioning as an output unit or read-out unit preferably with a display. The switch S or rather the power transistor switch T receives at its input K the output signal V from the comparator IC as will be described in more detail below.

The load element or its load resistance $R_{LOAD}$ is connected between ground and a junction point P which in turn is connected to the power supply voltage $U_V$ through the power transistor switch T.

The load element $R_{LOAD}$ may be an ohmic load or the load may have an ohmic and a capacitive component or an ohmic and an inductive component. As shown, the circuit arrangement of FIG. 3 is a so-called high side circuit because the power transistor switch T is connected to the power supply voltage $U_V$ while the load element $R_{LOAD}$ is connected with one end to ground and with its other end to the switch S.

The reference voltage or level $U_{REF}$ at the non-inverting or positive input of the comparator IC may, for example, be produced either by the reference signal generator CSG or it may be tapped off from a voltage divider as will be described in more detail below with reference to FIG. 4. This reference voltage or its level determines the short-circuit switch off point when a minimum voltage drop occurs across the load element $R_{LOAD}$. A fixed or static switch off point may be established or derived from a constant voltage such as a constant voltage source U shown in FIGS. 4 and 5.

The switch off point may also be determined by a voltage derived from the power supply or line voltage $U_V$ thereby providing a dynamic short-circuit threshold.

The feedback signal is transmitted through a feedback circuit connected between the junction P and the junction K' leading to the inverting or negative input of the comparator IC. The junction P is provided between the power transistor switch T and the load $R_{LOAD}$. A high ohmic resistor $R_7$ is preferably connected in parallel to the switch S or rather the power transistor switch T. The feedback circuit includes a current limiting resistor R4 and a decoupling resistor R3 for forming the feedback signal $U_{BACK}$, whereby the junction between the resistors $R_3$ and $R_4$ is connected through a Zenner diode $ZD_1$ to ground to provide an excess voltage protection. The resistor $R_4$ and the Zener diode $ZD_1$ are necessary in order to protect the input of the comparator IC and the output of the control signal generator CSG from the load voltage $U_V$. The decoupling resistor $R_3$ decouples the feedback voltage from the input of the comparator IC, thereby permitting a renewed switch off.

As mentioned, the monitor A in the form of a read-out or display device provides to the operator the information described above in connection with FIG. 1 by showing the instantaneous signal levels at the control input K in FIG. 2 or at the junction K' in FIG. 3. The evaluation of the signal levels in the monitor A shows particularly when the control signal generator CSG provides at its output the control signal $U_S$ in its Z-state and whether the load $R_{LOAD}$ is short-circuited. This is possible due to the shunting resistor $R_7$, whereby the control signal generator CSG receives a respective information in response to which the switch S is not switched ON. It is necessary in this connection that the shunting resistor $R_7$ is substantially larger than the resistance of the load $R_{LOAD}$. With such a shunting resistor it is possible to detect the condition of the circuit even if the switch S is in its OFF-state as described above.

Figure 4:
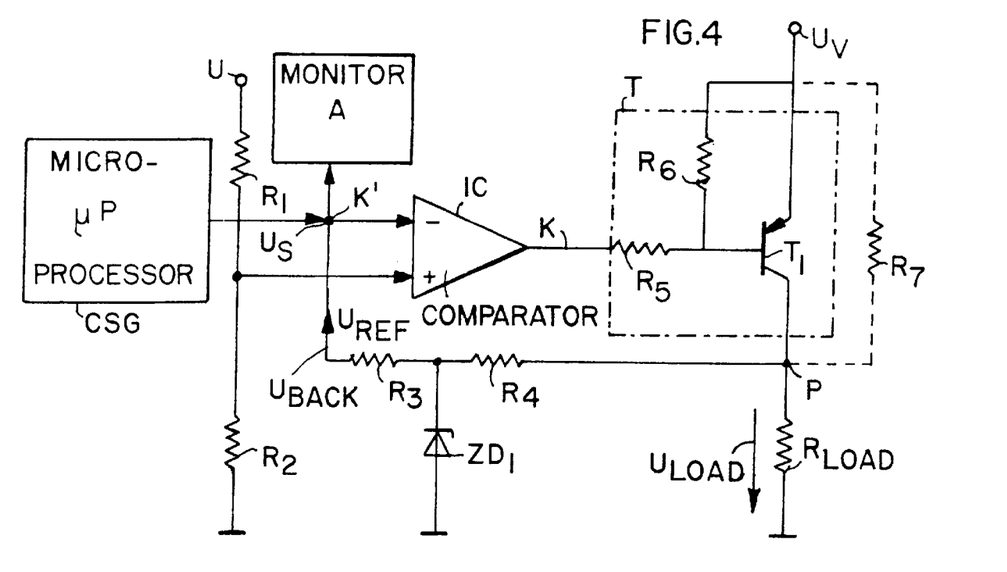
FIG. 4 is a circuit arrangement similar to that of FIG. 3, however illustrating the use of a bipolar transistor as the power switch arranged in the so-called "high side" circuit as in FIG. 3.
Figure 5:
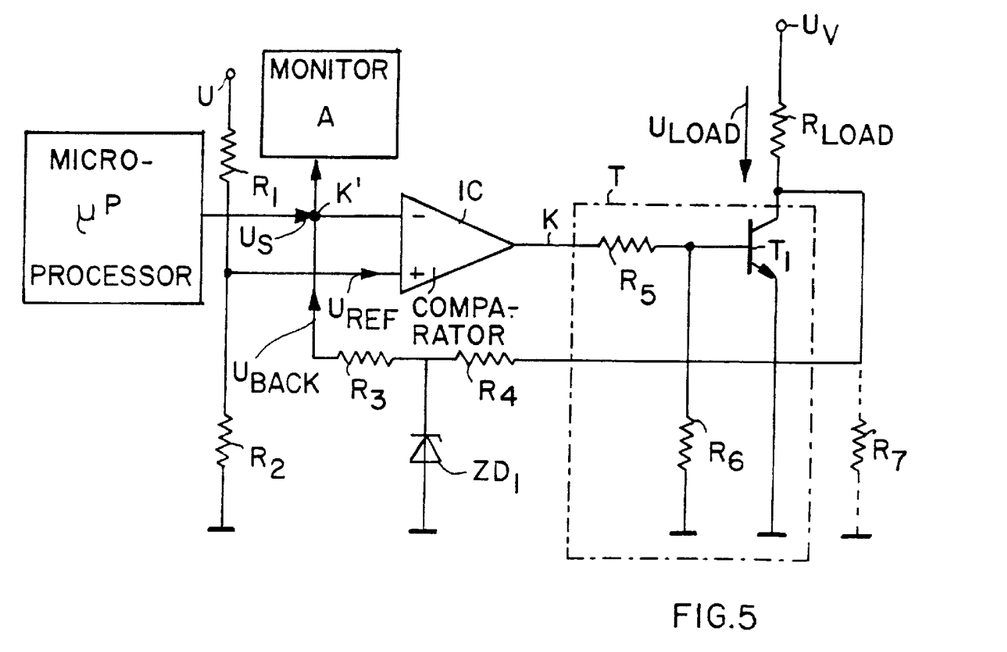
FIG. 5 is a circuit arrangement similar to that of FIG. 4, however illustrating a bipolar transistor power switch in the so-called "low side" circuit.

FIG. 4 illustrates another embodiment of a circuit arrangement according to the invention similar to that of FIG. 3, however showing further details of the electronic power switching output stage with a bipolar transistor $T_1$. The circuit arrangement is also a high side circuit with the switch connected to the power supply voltage $U_V$, whereby a resistor $R_5$ connects the output of the comparator IC to the base of the power transistor $T_1$ while a resistor $R_6$ connects the base with the emitter and with the power input voltage $U_V$. The reference voltage is provided as a tap-off voltage from a voltage divider comprising resistors $R_1$ and $R_2$ connected in series with each other between ground and the source of a voltage U which is preferably a constant voltage source. The remaining circuit features of the arrangement of FIG. 4 are the same as those of FIG. 3, except that in FIG. 4 an arrow in parallel to the load $R_{Load}$ indicates the voltage drop $U_{LOAD}$ across the load $R_{Load}$ element.

FIG. 5 illustrates a circuit arrangement similar to the circuit arrangements described above except that in FIG. 5 the power transistor switch T with the transistor $T_1$ is connected to the low side, or rather between ground and the load element $R_{LOAD}$, whereby the voltage drop $U_{LOAD}$ across the load $R_{LOAD}$ occurs between the power supply voltage $U_V$ and the collector of the transistor $T_1$, the emitter of which is connected to ground. Correspondingly, the input control resistor $R_6$ is connected between the base and ground rather than between the base and the emitter. The shunting resistor 7 is connected as in FIG. 4. All features that are identical in FIGS. 3, 4 and 5 have the same reference characters.

FIG. 6 shows a flow diagram of the tristate logic for the control signal generator CSG which receives its external start command, for example, from a manually operated starting switch. The flow diagram is self-explanatory.

Figure 7:
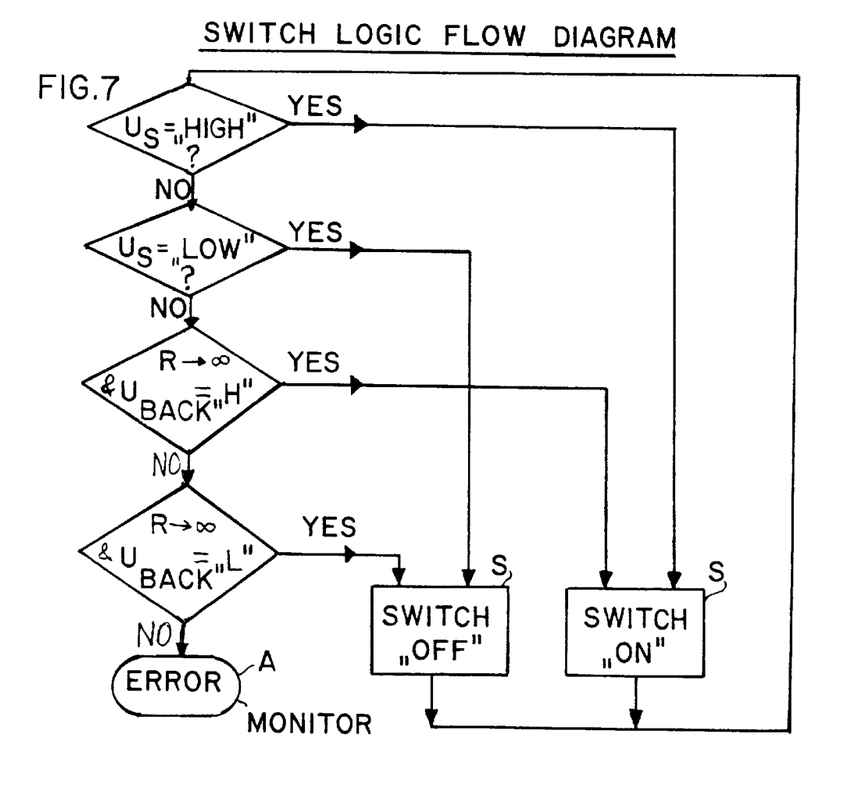
FIG. 7 shows a flow diagram for the logic switch operation according to the invention.

FIG. 7 illustrates a flow diagram of the switch logic diagram showing that the switch S can be switched on by the control signal $U_S$ at its high level or by the feedback signal at its respective high signal level when the control signal is in its Z-state. The switch S is switched off when the control signal $U_S$ is at its low state, or when the feedback signal is at its respective low state and the control signal is at its Z-state.

The basic advantages of the invention are seen in that an automatic short-circuit protection is provided in combination with a switch control that permits the monitoring of the switch and circuit status by means of an input/output port, for example in the form of the microprocessor $\mu P$. This means that the short circuit can occur any time during the switched ON-status of the circuit without destroying the power supply output switch due to the rapid switch off, thereby providing a self-protection for the output power switch S. Additionally, the status of the output switch can be determined independently of its ON or OFF condition in the form of a feedback reading with the help of the shunt resistor $R_7$. Moreover, as described above, high side circuit arrangements and low side circuit arrangements with bipolar or field effect transistors can be realized according to the invention. An interruption in the power supply circuit may be ascertained through the monitor A.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method for switching a power supply switch to its "ON-state" or to its "OFF-state" in response to a control signal ($U_S$) or in response to a feedback signal ($U_{BACK}$) representing a voltage drop across a load ($R_{Load}$) connected in a power supply circuit operated by said power supply switch, comprising the following steps:

(a) first generating a reference signal ($U_{ref}$) and supplying said reference signal to a first input of a comparator, (b) second, generating a feedback signal ($U_{BACK}$) representing a voltage drop across said load ($R_{Load}$) when said power supply switch (S) is in said "ON-state", and supplying said feedback signal to a second input of said comparator, (c) third generating and supplying to said second comparator input a control signal ($U_S$) that assumes at different times three different control signal levels, namely: a control signal high level higher than said reference signal for causing said "ON-state" of said power supply switch (S), a control signal low level lower than said reference signal for causing said "OFF-state" of said power supply switch (S), and a high impedance Z-state for enabling said feedback signal to maintain said "ON-state" of said power supply switch under normal operating conditions, (d) causing said "ON-state" by said control signal high level at said second input of said comparator, (e) maintaining said "ON-state" by said feedback signal as long as said feedback signal is larger than said reference signal and as long as said high impedance Z-state is applied by said control signal generator (CSG) to said second input of said comparator, and (f) switching said power supply switch to said "OFF-state" if said feedback signal falls below said reference signal in response to a fault in said power supply circuit while said Z-state is present or in response to said control signal low level applied to said second input of said comparator for overriding said feedback signal by said low level control signal.

2. The method of claim 1, further comprising providing a feedback circuit for forming said feedback signal in response to said voltage drop, feeding said feedback signal to said second input of said comparator, and adapting said feedback signal in said feedback circuit for said overriding.

3. The method of claim 1, further comprising connecting a monitor (A) to said second input of said comparator and detecting said "ON-state" and said "OFF-state" of said power supply switch in accordance with a signal level currently prevailing at said second input of said comparator.

4. The method of claim 3, further comprising detecting an interrupted status of said power supply circuit by applying said control signal high level to said second input of said comparator and further detecting an uninterrupted status of said power supply circuit by switching said control signal to said high impedance Z-state.

5. A method for controlling an ON/OFF state of a power supply switch in a power supply circuit including a load connected to said power supply circuit, comprising the following steps:

(a) generating a voltage drop signal across said load as a feedback signal that can assume a low state or a high state depending on an operating condition of said load, (b) supplying said feedback signal to an input (K) of said power supply switch for normally maintaining said ON-state of said power supply switch through said feedback signal when said feedback signal is in its high state, (c) generating a control signal ($U_S$) that can assume at different times a high level, a low level and a Z-state for controlling said power supply switch, and (d) supplying said control signal ($U_S$) to said input (K) of said power supply switch for causing said power supply switch to assume said ON-state in response to said control signal high level for permitting said feedback signal to normally maintain said ON-state when said control signal is in said Z-state, and for overriding said feedback signal when said control signal assumes said low level, whereby an OFF-state of said power supply switch is caused by said feedback signal when said feedback signal assumes its low state and said control signal ($U_S$) is in its Z-state or by said control signal ($U_S$) when said control signal is in said low state.

6. The method of claim 5, further comprising detecting said control signal and said feedback signal or its absence for monitoring an operational state of said power supply circuit.

7. A circuit arrangement for controlling an ON/OFF state of a power switch, comprising a power supply circuit, a load connected to said power supply circuit, a controllable power switch (S) in said power supply circuit for closing or interrupting said power supply circuit, said power switch comprising a control input (K), a feedback circuit connected to said load and to said control input of said power switch for providing a feedback signal in response to an operating condition of said load, and a control signal (CSG) generating circuit also connected to said control input (K) of said power switch (S) for supplying a control signal $U_S$) to said power switch (S), said control signal generator (CSG) providing said control signal ($U_S$) at three different control signal levels: high, Z-state, and low for causing an ON-state of said power switch in response to said high level of the control signal, for then enabling said feedback signal to maintain said ON-state of said power switch under normal operating conditions when said control signal is at said Z-state, and for overriding said feedback signal when said control signal is at said low level, whereby said power switch can be switched off by said feedback signal in response to a short-circuit when said control signal is in said Z-state or by said control signal ($U_S$) in its low state.

8. The circuit arrangement of claim 7, wherein said feedback circuit comprises a current limiting resistor (R4) and a decoupling resistor (R3) connected in series with each other at a junction, said feedback circuit further comprising a Zener diode connected between said junction and ground for providing an excess voltage protection.

9. The circuit arrangement of claim 7, further comprising a monitor (A) connected to said control input (K) of said controllable power switch for monitoring signal levels at said control input of said power switch.

10. The circuit arrangement of claim 7, further comprising a reference signal source for providing a reference signal, a comparator comprising an output connected to said control input of said power switch, a first comparator input connected to said reference signal generator and a second comparator input (K') connected to said feedback circuit and to said control signal generating circuit (CSG).

11. The circuit arrangement of claim 10, further comprising a high resistance resistor (R7) shunting said power switch.

12. The circuit arrangement of claim 10, further comprising a monitor (A) connected to said second comparator input (K') for monitoring signal levels at said second comparator input.

13. The circuit arrangement of claim 7, wherein said power switch comprises an electronic output power switching stage (T).

14. The circuit arrangement of claim 13, wherein said electronic output power switching stage (T) comprises a bipolar transistor and a resistor network connected to said bipolar transistor.

15. The circuit arrangement of claim 13, wherein said electronic output power switching stage (T) comprise a field effect transistor and a resistor network connected to said field effect transistor.

16. The circuit arrangement of claim 13, further comprising a power supply source connected to said power supply circuit, and wherein said electronic output power switching stage (T) is connected between said power supply source and said load which is connected to ground.

17. The circuit arrangement of claim 13, further comprising a power supply source connected to said power supply circuit, and wherein said load is connected between said power supply source and said electronic output power switching stage (T) which is connected to ground.

* * * * *

UNITED STATES PATENT AND TRADEMARK OFFICE
CERTIFICATE OF CORRECTION

PATENT NO. : 5,973,416
DATED : Oct. 26, 1999
INVENTOR(S) : Guenther

It is certified that error appears in the above-identified patent and that said Letters Patent is hereby corrected as shown below:

Col. 1, line 9, after "our", delete ",";
line 54, after "sheet", insert --1--;

Col. 5,
line 56, after "OFF"", insert --State--.

Col. 6, line 1, after "$U_{BACK}$", replace "and" by --to--;
line 49, after "the" (second occurrence), delete "it";

Col. 9, line 17, after "$R_{LOAD}$" delete "element";
line 38, before "is", insert --$U_s$--.

Signed and Sealed this

Twenty-ninth Day of August, 2000

Attest:

Q. TODD DICKINSON

*Attesting Officer*     *Director of Patents and Trademarks*